United States Patent
Lin et al.

(10) Patent No.: US 9,178,516 B1
(45) Date of Patent: Nov. 3, 2015

(54) VOLTAGE-LEVEL SHIFT APPARATUS AND METHOD OF OPERATING THE SAME

(71) Applicant: DELTA ELECTRONICS, INC., Guishan Township (TW)

(72) Inventors: Che-Hung Lin, Guishan Township (TW); Yueh-Lung Huang, Guishan Township (TW); Yen-Hung Chen, Guishan Township (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/465,238

(22) Filed: Aug. 21, 2014

(30) Foreign Application Priority Data

Jun. 6, 2014 (CN) .......................... 2014 1 0249574

(51) Int. Cl.
*H03L 5/00* (2006.01)
*H03K 19/0175* (2006.01)

(52) U.S. Cl.
CPC .............................. *H03K 19/017509* (2013.01)

(58) Field of Classification Search
None
See application file for complete search history.

(56) References Cited

U.S. PATENT DOCUMENTS

| | | | |
|---|---|---|---|
| 8,779,809 B2 * | 7/2014 | Murakami et al. | 327/112 |
| 2011/0169723 A1 * | 7/2011 | Hsu et al. | 326/80 |

* cited by examiner

*Primary Examiner* — Long Nguyen
(74) *Attorney, Agent, or Firm* — Hauptman Ham, LLP

(57) ABSTRACT

A voltage-level shift apparatus includes a first level shift unit, a second level shift unit, a charging unit, and a discharging unit. The first level shift unit receives a reference voltage and a power voltage to output a level-shifting voltage. The second level shift unit is connected to the first level shift unit and receives the level-shifting voltage. The charging unit receives a control voltage to provide an output voltage. The discharging unit is connected to the charging unit and receives the control voltage and the reference voltage. When the control voltage turns on the charging unit and turns off the discharging unit, the charging unit is charged by the level-shifting voltage. When the control voltage turns off the charging unit and turns on the discharging unit, the discharging unit is discharged from the output voltage.

10 Claims, 5 Drawing Sheets

VOLTAGE-LEVEL SHIFT APPARATUS AND METHOD OF OPERATING THE SAME

BACKGROUND

1. Technical Field

The present disclosure relates generally to a voltage-level shift apparatus and a method of operating the same, and more particularly to a voltage-level shift apparatus which is applied to a motor driver circuit and a method of operating the same.

2. Description of Related Art

The high-speed switching products currently on the market, such as the upper-bridge drive circuit of the brushless DC motor (BLDC), the energy control circuit of the LEDs, need the high-voltage drive circuit. Also, the voltage level of the drive voltage is usually higher than the input voltage of the system.

For the existing technology, it is easy to design the charge pump IC to provide a higher voltage level so that the charge pump IC is widely used in the industry. However, the charge pump IC needs higher costs. In addition, the lowest operation voltage and the charging and discharging efficiency are limited for the charge pump IC.

Accordingly, it is desirable to provide a voltage-level shift apparatus and a method of operating the same which is designed according to the application requirements by the research and development personnel to provide the voltage-level shift apparatus having customizing operation voltage and charging and discharging efficiency, thus avoid the over design condition.

SUMMARY

An object of the present disclosure is to provide a voltage-level shift apparatus to solve the above-mentioned problems. Accordingly, the voltage-level shift apparatus includes a first level shift unit, a second level shift unit, a charging unit, and a discharging unit. The first level shift unit receives a reference voltage and a power voltage to output a level-shifting voltage. The level-shifting voltage is equal to a sum of the reference voltage and the power voltage. The second level shift unit is connected to the first level shift unit and receives the level-shifting voltage. The charging unit receives a control voltage and the level-shifting voltage to provide the required voltage for a charging operation of the charging unit to output an output voltage. The discharging unit is connected to the charging unit and receives the control voltage and the reference voltage. The charging unit is charged by the level-shifting voltage and the level-shifting voltage is the output voltage outputted from the charging unit when the charging unit is turned on and the discharging unit is turned off by the control voltage; the discharging unit is discharged from the output voltage when the charging unit is turned off and the discharging unit is turned on by the control voltage.

Another object of the present disclosure is to provide a method of operating a voltage-level shift apparatus to solve the above-mentioned problems. Accordingly, the method includes the steps of: (a) providing a first level shift unit, the first level shift unit receives a reference voltage and a power voltage to output a level-shifting voltage; wherein the level-shifting voltage is equal to a sum of the reference voltage and the power voltage; (b) providing a second level shift unit, the second level shift unit is connected to the first level shift unit and receives the level-shifting voltage; (c) providing a charging unit, the charging unit configured to receive a control voltage and the level-shifting voltage to provide the required voltage for a charging operation of the charging unit to output an output voltage; (d) providing a discharging unit, the discharging unit connected to the charging unit and configured to receive the control voltage and the reference voltage; and (e) charging the charging unit by the level-shifting voltage and the level-shifting voltage is the output voltage outputted from the charging unit when the charging unit is turned on and the discharging unit is turned off by the control voltage; discharging the discharging unit from the output voltage when the charging unit is turned off and the discharging unit is turned on by the control voltage.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Figure 1:
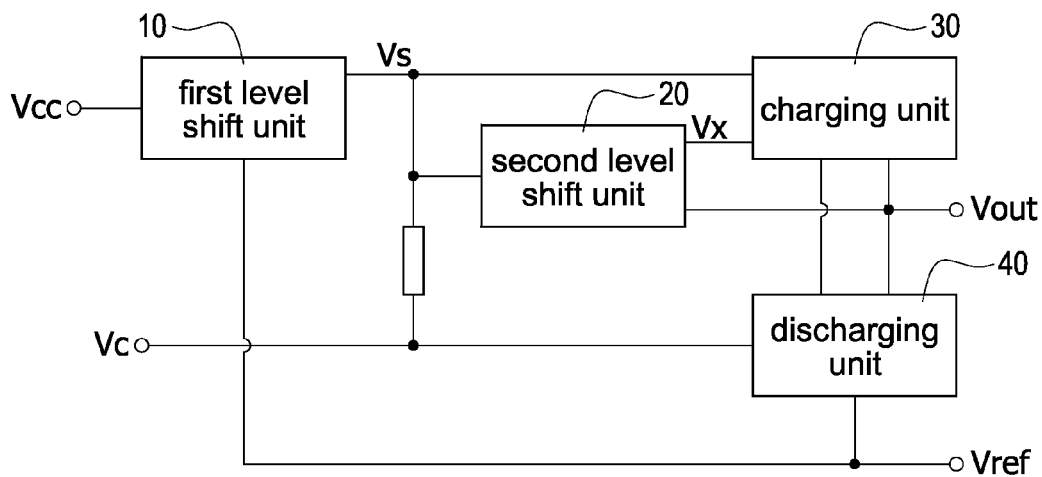
FIG. 1 is a schematic block diagram of a voltage-level shift apparatus according to the present disclosure.

Reference will now be made to the drawing figures to describe the present invention in detail.

Reference is made to FIG. 1 which is a schematic block diagram of a voltage-level shift apparatus according to the present disclosure. The voltage-level shift apparatus includes a first level shift unit 10, a second level shift unit 20, a charging unit 30, and a discharging unit 40. The first level shift unit 10 receives a reference voltage Vref and a power voltage Vcc to output a level-shifting voltage Vs. Especially, the level-shifting voltage Vs is equal to a sum of the reference voltage Vref and the power voltage Vcc, namely, Vs=Vref+Vcc. For example, if the reference voltage Vref is 20 volts and the power voltage Vcc is 12 volts, the level-shifting voltage Vs outputted from the first level shift unit 10 is 32 volts. The second level shift unit 20 is connected to the first level shift unit 10 and receives the level-shifting voltage Vs to provide a conversion voltage Vx. The charging unit 30 receives a control voltage Vc and the level-shifting voltage Vs to provide the required voltage for a charging operation of the charging unit 30 to output an output voltage Vout. The discharging unit 40 is connected to the charging unit 30 and receives the control voltage Vc and the reference voltage Vref. The charging unit 30 is charged by the level-shifting voltage Vs and the level-shifting voltage Vs is the output voltage Vout outputted from the charging unit 30 when the charging unit 30 is turned on and the discharging unit 40 is turned off by the control voltage Vc. On the contrary, the discharging unit 40 is discharged from the output voltage Vout when the charging unit 30 is turned off and the discharging unit 40 is turned on by the control voltage Vc. The detailed operation of the voltage-level shift apparatus will be described hereinafter as follows.

Figure 2:
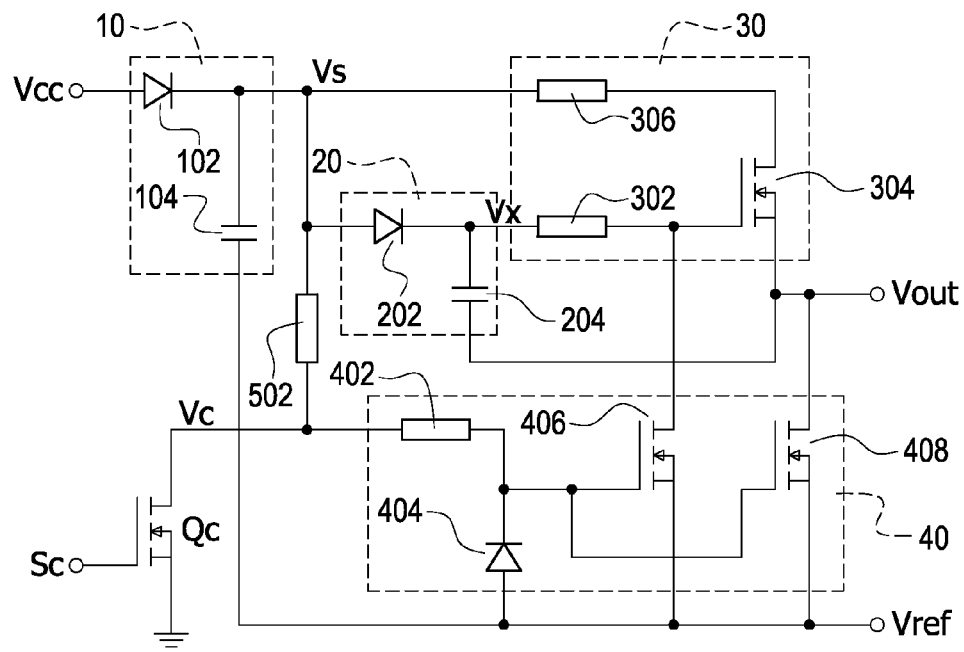
FIG. 2 is a circuit diagram of the voltage-level shift apparatus according to the present disclosure.

Reference is made to FIG. 2 which is a circuit diagram of the voltage-level shift apparatus according to the present disclosure. Further detailed circuit components in each circuit unit are disclosed. The first level shift unit 10 has a first diode 102 and a first capacitor 104 connected to the first diode 102. The first capacitor 104 is connected to a cathode of the first diode 102. The second level shift unit 20 has a second diode 202 and a second capacitor 204 connected to the second diode 202. The second capacitor 204 is connected to a cathode of the second diode 202. The charging unit 30 has a first resistor 302 and a first power switch 304. A gate of the first power switch 304 is connected to one terminal of the first resistor 302. The discharging unit 40 has a second resistor 402, a third diode 404, a second power switch 406, and a third power switch 408. A cathode of the third diode 404 is connected one terminal of the second resistor 402, a gate of the second power switch 406, and a gate of the third power switch 408.

The charging unit 30 further has a current-limiting resistor 306. The current-limiting resistor 306 is connected to a drain of the first power switch 304 and the cathode of the first diode 102 to limit a current flowing from the first level shift unit 10 to the charging unit 30. Especially, the control voltage Vc is produced by controlling a power switch Qc by a control signal Sc. The control signal Sc can be a pulse-width modulation (PWM) signal. An isolation resistor 502 is connected between the level-shifting voltage Vs and the control voltage Vc, namely, the isolation resistor 502 is connected between the input side of the second level shift unit 20 and the input side of the discharging unit 40 to provide an electrical isolation between the level-shifting voltage Vs and the control voltage Vc.

Figure 3:
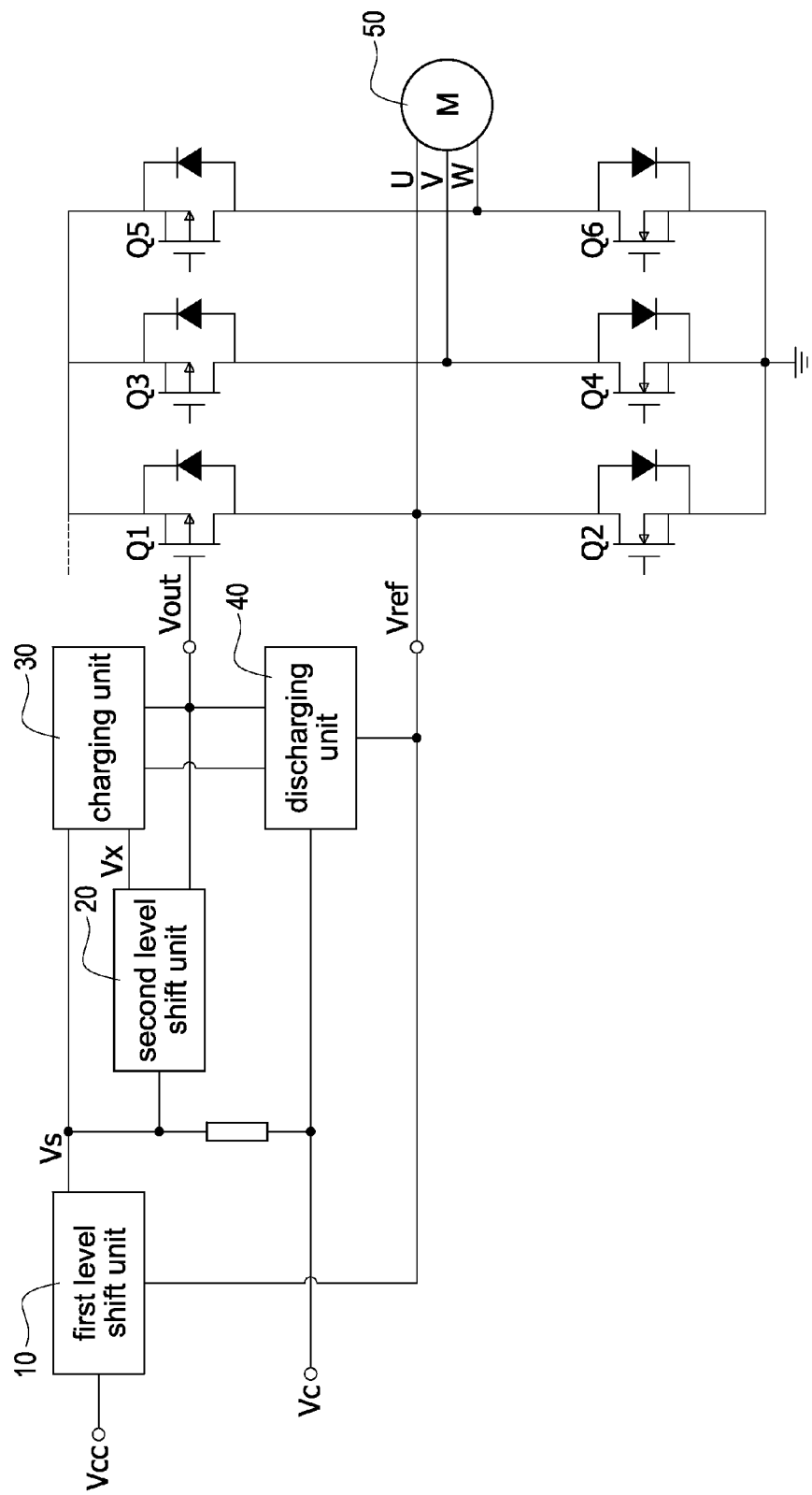
FIG. 3 is a circuit diagram of applying the voltage-level shift apparatus to drive a motor according to the present disclosure.

Reference is made to FIG. 3 which is a circuit diagram of applying the voltage-level shift apparatus to drive a motor according to the present disclosure. Especially, the voltage-level shift apparatus is applied to a motor drive circuit. More specifically, the output voltage Vout outputted from the charging unit 30 is connected to a conversion circuit to drive and control a motor 50. Taking the three-phase motor drive system for example, the conversion circuit is composed of three bridge arms connected in parallel to each other, and each bridge arm has two power switch elements connected in series. The output voltage Vout outputted from the charging unit 30 is connected to a gate of a first bridge arm switch Q1 of a first bridge arm, and the reference voltage Vref connected to the first level shift unit 10 and the discharging unit 40 is connected to one phase winding of the motor 50. In this embodiment, the reference voltage Vref is connected to the U-phase winding of the motor 50, but not limited. More specifically, FIG. 3 shows only the voltage-level shift apparatus which is connected to the U-phase winding of the motor 50 and the first bridge arm switch Q1. For the three-phase motor drive system, each phase thereof is connected to one voltage-level shift apparatus. In other words, the V-phase winding and a third bridge arm switch Q3, and the W-phase winding and a fifth bridge arm switch Q5 are connected to one voltage-level shift apparatus, respectively.

Reference is made to FIG. 2 again, the voltage-level shift apparatus connecting to the U-phase winding of the motor 50 is exemplified for further demonstration. The initial condition of the motor drive system including the voltage-level shift apparatus and the conversion circuit is described as follows. When the motor 50 is stationary, the reference voltage Vref is zero volt and it is assumed that the power voltage Vcc is 12 volts, the level-shifting voltage Vs outputted from the first level shift unit 10 is 12 volts.

When the control signal Sc is in a low-level condition, the power switch Qc is turned off. Because the level-shifting voltage Vs is greater than the reference voltage Vref, the gate voltage is greater than the source voltage of the second power switch 406 more than one voltage value and the gate voltage is greater than the source voltage of the third power switch 408 more than one voltage value so that the second power switch 406 and the third power switch 408 are turned. Also, the first power switch 304 is turned off because the gate voltage is equal to the source voltage of the first power switch 304.

Afterward, the power switch Qc is turned on when the control signal Sc is in a high level. Because the gate voltage is equal to the source voltage of the second power switch 406 (both are equal to the reference voltage Vref) and the gate voltage is equal to the source voltage (both are equal to the reference voltage Vref) of the third power switch 408, the second power switch 406 and the third power switch 408 are turned off. Also, the first power switch 304 is turned on because the gate voltage is greater than the source voltage of the first power switch 304 more than one voltage value. At this time, the level-shifting voltage Vs (12 volts) simultaneously supplied power to the charging unit 30 and the second level shift unit 20 to output an output voltage Vout (12 volts). Especially, the level-shifting voltage Vs supplies power to the charging unit 30 means that the level-shifting voltage Vs charges a parasitic capacitance Ciss of the first power switch 304 of the charging unit 30. In other words, a charging path is formed between the first power switch 304 and the output voltage Vout when the level-shifting voltage Vs charges the charging unit 30.

Afterward, when the control signal Sc is in the low-level condition again, the power switch Qc is turned off. Because the level-shifting voltage Vs is greater than the reference voltage Vref, the second power switch 406 and the third power switch 408 are turned, and the first power switch 304 is turned off. At this time, a discharging path is formed between the output voltage Vout and the reference voltage Vref via the third power switch 408.

In brief, the gate of the first power switch 304 is controlled by turning on or turning off the second power switch 406 to turn off or turn on the first power switch 304. In other words, the first power switch 304 is turned off when the second power switch 406 is turned on. On the contrary, the first power switch 304 is turned on when the second power switch 406 is turned off.

Because the output voltage Vout is connected to the gate of the first bridge arm switch Q1, the output voltage Vout is provided to drive the gate of the first bridge arm switch Q1. In addition, because the reference voltage Vref is connected to the U-phase winding of the motor 50 and the reference voltage Vref is not a fixed zero-volt voltage, but a varied sinusoidal voltage, the output voltage Vout outputted from the charging unit 30 can accurately drive and switch the bridge arm switches of the conversion circuit of the motor 50 depending on the varied sinusoidal reference voltage Vref.

Figure 4:
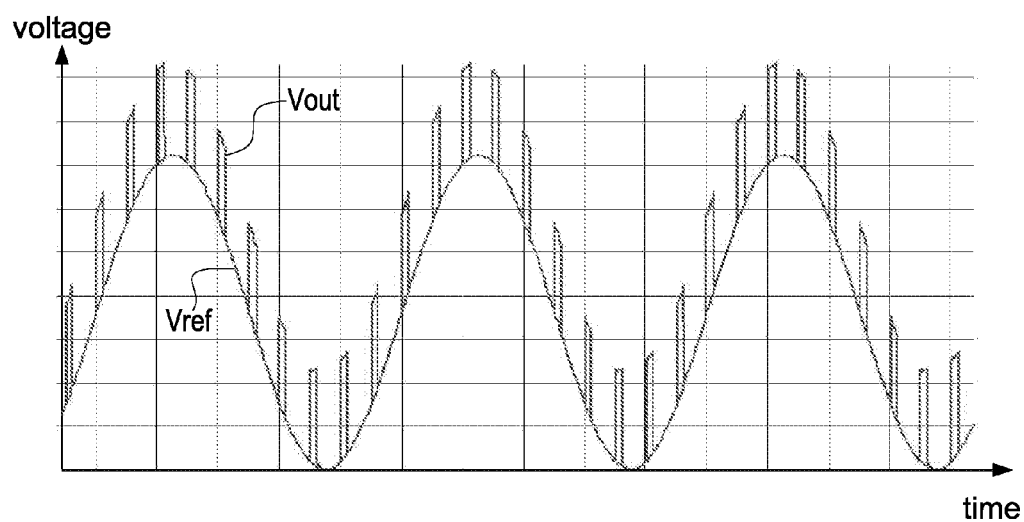
FIG. 4 is a schematic waveform chart of an output voltage and a reference voltage according to the present disclosure.
Figure 5:
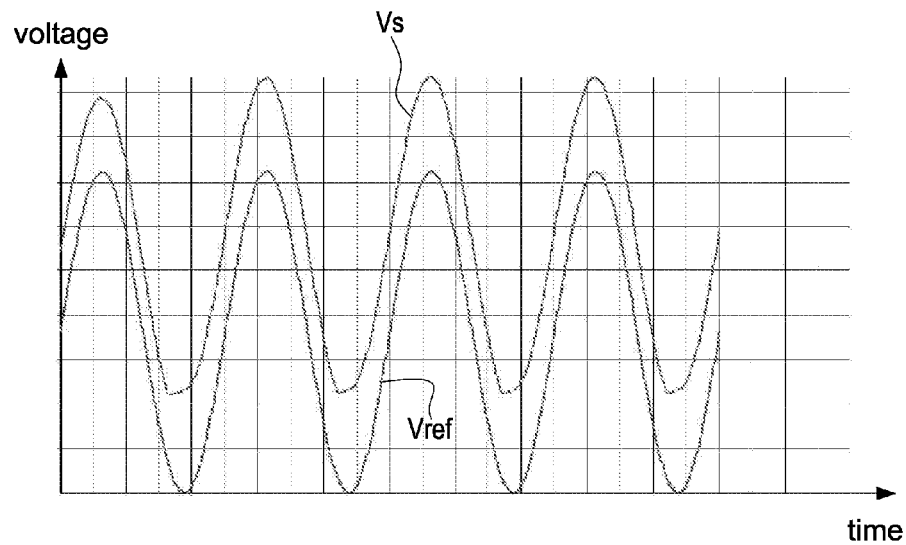
FIG. 5 is a schematic waveform chart of a level-shifting voltage and the reference voltage according to the present disclosure.
Figure 6:
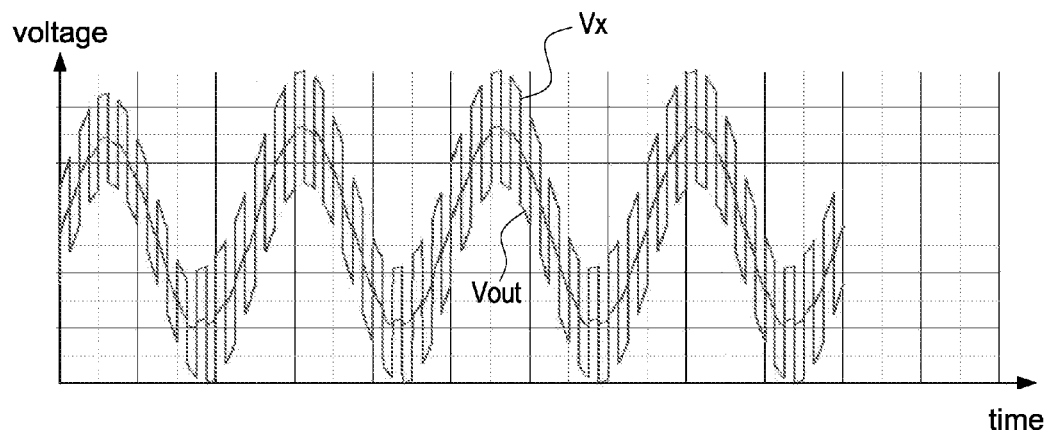
FIG. 6 is a schematic waveform chart of a conversion voltage and the output voltage according to the present disclosure.

Reference is made to FIG. 4 to FIG. 6 which are schematic waveform charts of an output voltage and a reference voltage, a level-shifting voltage and the reference voltage, and a conversion voltage and the output voltage according to the present disclosure, respectively. As shown in FIG. 4, the level-shifting voltage Vs is equal to the sum of the reference voltage Vref and the power voltage Vcc. Also, the level shift of the output voltage Vout is determined by the power voltage Vcc when the output voltage Vout outputs the level-shifting voltage Vs, and the switching frequency of the output voltage Vout is determined by the switching frequency of the PWM signal. FIG. 5 shows the waveform charts of operating the first level shift unit 10, that is the level-shifting voltage Vs is equal to the sum of the reference voltage Vref and the power voltage Vcc. In other words, a voltage difference between the two voltages is the power voltage Vcc. FIG. 6 shows the waveform charts of operating the second level shift unit 20, that is a voltage difference between the conversion voltage Vx and the output voltage Vout is the level-shifting voltage Vs.

Figure 7:
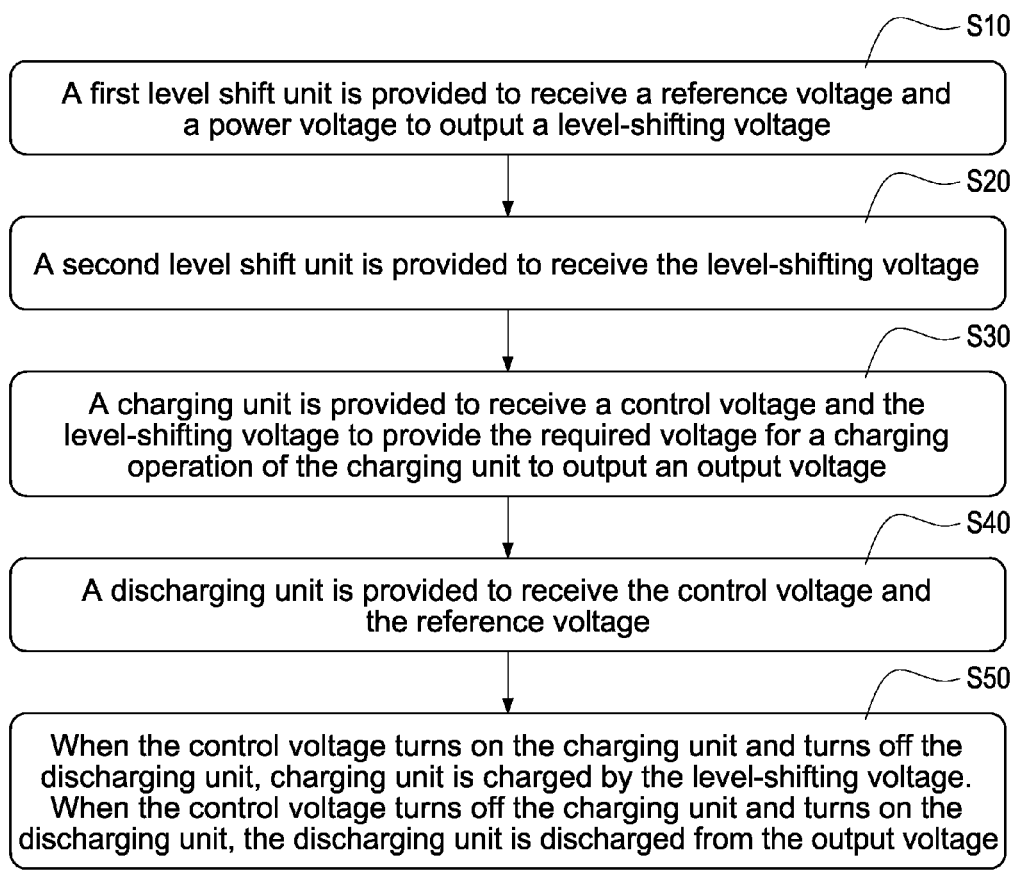
FIG. 7 is a flowchart of a method of operating a voltage-level shift apparatus according to the present disclosure.

Reference is made to FIG. 7 which is a flowchart of a method of operating a voltage-level shift apparatus according to the present disclosure. The method of operating the voltage-level shift apparatus includes following steps. First, a first level shift unit is provided, and the first level shift unit receives a reference voltage and a power voltage to output a level-shifting voltage (S10). The level-shifting voltage is equal to a sum of the reference voltage and the power voltage. The first level shift unit has a first diode and a first capacitor connected to the first diode. The first capacitor is connected to a cathode of the first diode. Afterward, a second level shift unit is provided, and the second level shift unit is connected to the first level shift unit and receives the level-shifting voltage (S20). The second level shift unit has a second diode and a second capacitor connected to the second diode. The second capacitor is connected to a cathode of the second diode.

Afterward, a charging unit is provided, and the charging unit receives a control voltage and the level-shifting voltage to provide the required voltage for a charging operation of the charging unit to output an output voltage (S30). The charging unit has a first resistor and a first power switch. A gate of the first power switch is connected to one terminal of the first resistor. In addition, the charging unit further has a current-limiting resistor. The current-limiting resistor is connected to a drain of the first power switch and the cathode of the first diode to limit a current flowing from the first level shift unit to the charging unit. Afterward, a discharging unit is provided, and the discharging unit is connected to the charging unit and receives the control voltage and the reference voltage (S40). The discharging unit has a second resistor, a third diode, a second power switch, and a third power switch. A cathode of the third diode is connected one terminal of the second resistor, a gate of the second power switch, and a gate of the third power switch. Especially, the control voltage is produced by controlling a power switch by a control signal. The control signal can be a pulse-width modulation (PWM) signal.

Finally, when the control voltage turns on the charging unit and turns off the discharging unit, the charging unit is charged by the level-shifting voltage so that the level-shifting voltage is the output voltage outputted from the charging unit. Also, when the control voltage turns off the charging unit and turns on the discharging unit, the discharging unit is discharged from the output voltage (S50).

When the control signal is in a low-level condition, the power switch is turned off. Because the level-shifting voltage is greater than the reference voltage, the gate voltage is greater than the source voltage of the second power switch more than one voltage value and the gate voltage is greater than the source voltage of the third power switch more than one voltage value so that the second power switch and the third power switch are turned. Also, the first power switch is turned off because the gate voltage is equal to the source voltage of the first power switch.

Afterward, the power switch is turned on when the control signal is in a high level. Because the gate voltage is equal to the source voltage of the second power switch (both are equal to the reference voltage) and the gate voltage is equal to the source voltage (both are equal to the reference voltage) of the third power switch, the second power switch and the third power switch are turned off. Also, the first power switch is turned on because the gate voltage is greater than the source voltage of the first power switch more than one voltage value. At this time, the level-shifting voltage (12 volts) simultaneously supplied power to the charging unit and the second level shift unit to output an output voltage (12 volts). Especially, the level-shifting voltage supplies power to the charging unit means that the level-shifting voltage charges a parasitic capacitance of the first power switch of the charging unit. In other words, a charging path is formed between the first power switch and the output voltage when the level-shifting voltage charges the charging unit.

Afterward, when the control signal is in the low-level condition again, the power switch is turned off. Because the level-shifting voltage is greater than the reference voltage, the second power switch and the third power switch are turned, and the first power switch is turned off. At this time, a discharging path is formed between the output voltage and the reference voltage via the third power switch.

In brief, the gate of the first power switch is controlled by turning on or turning off the second power switch to turn off or turn on the first power switch. In other words, the first power switch is turned off when the second power switch is turned on. On the contrary, the first power switch is turned on when the second power switch is turned off.

Because the output voltage is connected to the gate of the first bridge arm switch, the output voltage is provided to drive the gate of the first bridge arm switch. In addition, because the reference voltage is connected to the U-phase winding of the motor and the reference voltage is not a fixed zero-volt voltage, but a varied sinusoidal voltage, the output voltage outputted from the charging unit can accurately drive and switch the bridge arm switches of the conversion circuit of the motor depending on the varied sinusoidal reference voltage.

In conclusion, the present disclosure has following advantages:

1. The voltage-level shift apparatus is designed according to the application requirements by the research and development personnel to provide the voltage-level shift apparatus having customizing operation voltage and charging and discharging efficiency, thus avoid the over design condition;

2. The voltage-level shift apparatus can be operated under a wide operation voltage range so as to overcome the limitation of the minimum operation voltage; and 3. The two-stage voltage shift, namely, the first level shift unit 10 and the second level shift unit 20 is used to not only provide the level-shifting function by the first level shift unit 10 but also provide the fast discharging function by the second level shift unit 20.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A voltage-level shift apparatus comprising:
a first level shift unit configured to receive a reference voltage and a power voltage to output a level-shifting voltage; wherein the level-shifting voltage is equal to a sum of the reference voltage and the power voltage;
a second level shift unit connected to the first level shift unit and configured to receive the level-shifting voltage;
a charging unit configured to receive a control voltage and the level-shifting voltage to provide a required voltage for a charging operation of the charging unit to output an output voltage; and
a discharging unit connected to the charging unit and configured to receive the control voltage and the reference voltage;
wherein the charging unit is charged by the level-shifting voltage and the level-shifting voltage is the output voltage outputted from the charging unit when the charging unit is turned on and the discharging unit is turned off by the control voltage; the discharging unit is discharged from the output voltage when the charging unit is turned off and the discharging unit is turned on by the control voltage.

2. The voltage-level shift apparatus in claim 1, wherein the first level shift unit comprises a first diode and a first capacitor connected to the first diode; the second level shift unit comprises a second diode and a second capacitor connected to the second diode.

3. The voltage-level shift apparatus in claim 2, wherein the charging unit comprises a first resistor and a first power switch, wherein a gate of the first power switch is connected to one terminal of the first resistor; the discharging unit comprises a second resistor, a third diode, a second power switch, and a third power switch, wherein a cathode of the third diode is connected to one terminal of the second resistor, a gate of the second power switch, and a gate of the third power switch.

4. The voltage-level shift apparatus in claim 3, wherein the second power switch and the third power switch of the discharging unit are turned on and the first power switch of the charging unit is turned off when the control voltage is a low-level voltage; the second power switch and the third power switch of the discharging unit are turned off and the third power switch of the charging unit is turned on when the control voltage is a high-level voltage.

5. The voltage-level shift apparatus in claim 3, wherein the charging unit further comprises a current-limiting resistor; the current-limiting resistor is connected to a drain of the first power switch for limiting a current flowing from the first level shift unit to the charging unit.

6. A method of operating a voltage-level shift apparatus, comprising steps of:
(a) providing a first level shift unit, the first level shift unit configured to receive a reference voltage and a power voltage to output a level-shifting voltage; wherein the level-shifting voltage is equal to a sum of the reference voltage and the power voltage;
(b) providing a second level shift unit, the second level shift unit connected to the first level shift unit and configured to receive the level-shifting voltage;
(c) providing a charging unit, the charging unit configured to receive a control voltage and the level-shifting voltage to provide a required voltage for a charging operation of the charging unit to output an output voltage;
(d) providing a discharging unit, the discharging unit connected to the charging unit and configured to receive the control voltage and the reference voltage; and
(e) charging the charging unit by the level-shifting voltage and the level-shifting voltage is the output voltage outputted from the charging unit when the charging unit is turned on and the discharging unit is turned off by the control voltage; discharging the discharging unit from the output voltage when the charging unit is turned off and the discharging unit is turned on by the control voltage.

7. The method of operating the voltage-level shift apparatus in claim 6, wherein the first level shift unit comprises a first diode and a first capacitor connected to the first diode; the second level shift unit comprises a second diode and a second capacitor connected to the second diode.

8. The method of operating the voltage-level shift apparatus in claim 7, wherein the charging unit comprises a first resistor and a first power switch, wherein a gate of the first power switch is connected to one terminal of the first resistor; the discharging unit comprises a second resistor, a third diode, a second power switch, and a third power switch, wherein a cathode of the third diode is connected to one terminal of the second resistor, a gate of the second power switch, and a gate of the third power switch.

9. The method of operating the voltage-level shift apparatus in claim 8, wherein the second power switch and the third power switch of the discharging unit are turned on and the first power switch of the charging unit is turned off when the control voltage is a low-level voltage; the second power switch and the third power switch of the discharging unit are turned off and the third power switch of the charging unit is turned on when the control voltage is a high-level voltage.

10. The method of operating the voltage-level shift apparatus in claim 8, wherein the charging unit further comprises a current-limiting resistor; the current-limiting resistor is connected to a drain of the first power switch for limiting a current flowing from the first level shift unit to the charging unit.

* * * * *